United States Patent
Berkenbush et al.

(10) Patent No.: US 12,295,122 B2
(45) Date of Patent: May 6, 2025

(54) COOLANT FLOW PARTITION FOR COOLING 3U BOARDS IN 6U CHASSIS

(71) Applicant: BAE SYSTEMS Information and Electronic Systems Integration Inc., Nashua, NH (US)

(72) Inventors: Richard E. Berkenbush, Pompton Plains, NJ (US); Robert E. Scholl, Morristown, NJ (US); Meredith T. Thanos, Morris Plains, NJ (US); Robert S. Foster, Wharton, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 252 days.

(21) Appl. No.: 18/195,623

(22) Filed: May 10, 2023

(65) Prior Publication Data
US 2024/0381584 A1 Nov. 14, 2024

(51) Int. Cl.
H05K 7/20 (2006.01)
G06F 1/18 (2006.01)
G06F 1/20 (2006.01)

(52) U.S. Cl.
CPC ......... *H05K 7/20763* (2013.01); *G06F 1/183* (2013.01); *G06F 1/20* (2013.01)

(58) Field of Classification Search
None
See application file for complete search history.

(56) References Cited

U.S. PATENT DOCUMENTS

| | | |
|---|---|---|
| 6,661,657 B1 | 12/2003 | Banton |
| 6,781,831 B1 | 8/2004 | Banton |
| 6,879,486 B1 | 4/2005 | Banton |
| 7,218,517 B2 | 5/2007 | Wolford |
| 7,345,877 B2 | 3/2008 | Asfia |
| 7,796,384 B2 | 9/2010 | Irving |
| 7,961,465 B2 | 6/2011 | Goldrian |

(Continued)

FOREIGN PATENT DOCUMENTS

| | | |
|---|---|---|
| WO | 2010138824 A2 | 12/2010 |
| WO | 2014004853 A1 | 1/2014 |

OTHER PUBLICATIONS

Notice of Allowance for U.S. Appl. No. 18/195,538 mail date Oct. 1, 2024, 14 pages.

(Continued)

*Primary Examiner* — Xanthia C Relford
(74) *Attorney, Agent, or Firm* — Maine Cernota & Curran

(57) ABSTRACT

A chassis configured to hold a cards of at least two form factors comprising: slots disposed in an inner portion the chassis, wherein the slots are aligned with one another and configured to act as card guides; a mid-height structure disposed adjacent a side wall of the chassis, the mid-height structure comprising a second plurality of slots and a third plurality of slots disposed on top and bottom surfaces of the mid-height structure that are substantially parallel to top and bottom walls of the chassis; and a plurality of cooling channels disposed within the walls of the chassis as well as within the mid-height structure, wherein the second and third plurality of slots are configured to align with at least a subset of the plurality of slots disposed in the top and bottom chassis walls and to act as card guides.

20 Claims, 10 Drawing Sheets

(56) References Cited

U.S. PATENT DOCUMENTS

| | | | |
|---|---|---|---|
| 8,164,906 B2 | 4/2012 | Franco | |
| 8,416,570 B2 | 4/2013 | Zeng | |
| 8,861,213 B2 | 10/2014 | Sisler | |
| 9,258,925 B2 | 2/2016 | Arvelo | |
| 9,398,682 B2 | 7/2016 | Patil | |
| 9,426,931 B2 | 8/2016 | Kaplun | |
| 9,468,131 B2* | 10/2016 | Brandt | H05K 7/20254 |
| 10,136,557 B2* | 11/2018 | Kim | H05K 7/20336 |
| 10,178,800 B2 | 1/2019 | Mahalingam | |
| 10,264,701 B1 | 4/2019 | Norton | |
| 10,433,465 B2 | 10/2019 | North | |
| 10,772,188 B1 | 9/2020 | Elsasser | |
| 10,881,030 B1* | 12/2020 | Lunsman | H05K 7/1487 |
| 11,071,221 B2 | 7/2021 | Holahan | |
| 2003/0057546 A1* | 3/2003 | Memory | F28D 15/0266 |
| | | | 257/706 |
| 2007/0256957 A1* | 11/2007 | Herrmann | H05K 7/20645 |
| | | | 206/710 |
| 2008/0007913 A1* | 1/2008 | Sullivan | H05K 7/20636 |
| | | | 361/699 |
| 2008/0298014 A1 | 12/2008 | Franco | |
| 2010/0053901 A1 | 3/2010 | Irving | |
| 2012/0193138 A1* | 8/2012 | Jones | H05K 7/202 |
| | | | 174/547 |
| 2015/0070848 A1 | 3/2015 | Zemke | |
| 2015/0305198 A1* | 10/2015 | Brandt | H05K 7/20218 |
| | | | 361/699 |
| 2015/0372403 A1 | 12/2015 | Lam | |
| 2016/0029514 A1 | 1/2016 | Alakoc | |
| 2017/0112018 A1 | 4/2017 | Krivonak | |
| 2018/0153057 A1 | 5/2018 | Chen | |
| 2019/0246523 A1* | 8/2019 | Boyden | H05K 7/20445 |
| 2019/0320556 A1 | 10/2019 | Dariavach | |
| 2020/0029469 A1* | 1/2020 | McCordic | H05K 7/20645 |
| 2020/0100388 A1 | 3/2020 | Hernandez-Toldeo | |
| 2020/0163251 A1* | 5/2020 | Chopra | G06F 1/20 |
| 2020/0214153 A1* | 7/2020 | Holahan | H05K 5/0213 |
| 2022/0256743 A1 | 8/2022 | Pelletier | |
| 2022/0418170 A1* | 12/2022 | Duffy | H05K 7/20272 |

OTHER PUBLICATIONS

International Search Report, PCT/US24/27976, mailed Aug. 1, 2024, 11 pages.

* cited by examiner

COOLANT FLOW PARTITION FOR COOLING 3U BOARDS IN 6U CHASSIS

STATEMENT OF GOVERNMENT INTEREST

The invention was made with United States Government support under Contract No. 19-F-2503 awarded by a classified agency. The United States Government has certain rights in this invention.

RELATED APPLICATIONS

This application is related to co-pending U.S. application Ser. No. 18/195,538, filed May 10, 2023, also by the present Applicant, which is herein incorporated by reference in its entirety for all purposes.

FIELD OF THE DISCLOSURE

The following disclosure relates generally to cooling of computing equipment, and, more specifically, to cooling of undersized cards in an oversized chassis.

BACKGROUND

For many applications, it can be convenient to mount a plurality of printed circuit boards (PCBs) in a common chassis. For example, a plurality of PCBs can be slid into "slots" formed by card guides provided on the top and bottom of a chassis so that the PCBs stand on end, like books on a shelf. One or more connectors can be provided at the rear edges or "spines" of the PCBs, which plug into mating connectors on a "motherboard" or "backplane" of the chassis.

One of the advantages of assembling PCBs vertically in chassis is that this is a flexible and convenient approach for assembling an electronically-dense device. This can be attractive for applications that benefit from designs that consume a minimum of space. The density of the electronics in such an assembly, however, can result in the generation of excessive heat, especially if EMI panels, which seal the chassis, are installed.

Excessive heat can be addressed in any of several ways. In some cases, "air cooling" is implemented, whereby a fan or similar device causes ambient or chilled air, or another gas such as nitrogen, to pass continuously between the PCBs in the chassis. While this approach can be helpful, gases generally have a low heat capacity and gases in the vicinity of the chassis may already be at elevated temperatures, both of which limit the rate at which heat can be removed using this method. Furthermore, this approach can be difficult or impossible to implement if the chassis is EMI shielded, because EMI shielding requires full enclosure of the environment by conductive barriers, making it difficult or impossible to provide open ports through which a cooling gas could be introduced into and exhausted from the chassis.

Instead, when removal of large amounts of heat is required and/or where the PCB chassis assemblies must operate in harsh environments, they are sometimes cooled by a flowing liquid. According to this approach, upper and lower internal cooling channels through which the cooling liquid is circulated in close thermal contact with the channel guides are provided within the top and bottom of the chassis, respectively. Metal baffles can be provided within the cooling channels to significantly increase the exchange of heat between the cooling liquid and the chassis as the liquid circulates. An interconnecting hose is generally used to interconnect the upper and lower channels into a single cooling circulation path.

The slot guides of such chassis, which are often referred to as "wedge locks," are machined to be highly smooth, and to make reliable and firm, high-surface-area contact with the upper and lower edges of the PCBs, while still enabling the PCBs to be slid into and out of the slots. Often, the PCBs will include copper backplanes and/or ground traces that are able to efficiently transfer heat from throughout the PCB to the top and bottom edges that are in contact with the chassis. In some cases, the PCBs include expandable clamps or jacks along their upper and lower edges that can be deployed to ensure optimal thermal contact with and sturdy mounting within the channel guides.

One example of this approach is the "Eurocard" PCB standard and associated chassis. Eurocards are available in various heights, measured in "rack units" or "U's," where 1 U is equal to 1.75 inches (44.45 mm). Two common heights of Eurocards are 3 U (a 100 mm card in a 5.25 in (133.35 mm) sub-rack) and 6 U (a 233.35 mm card in a 10.5 in (266.70 mm) high sub-rack). As two 3 U cards are shorter than one 6 U card (by 33.35 mm), it is possible to install two 3 U cards in one slot of a 6 U sub-rack, using a mid-height structure for proper support, providing a great deal of flexibility to end users, allowing them to incorporate a wide breadth of technological solutions into system designs.

While multiple 3 U cards can be installed in one slot of a 6 U sub-rack, with a mid-height structure for proper support, this configuration often leads to a poor thermal interface with the liquid cooling media on one side of the 3 U card. This is because the liquid cooling media passes through the chassis' outer side walls where the 6 U and outer 3 U wedge locks are located and not through the center 3 U card rails, resulting in their becoming relatively hotter. This flow of cooling media creates uneven cooling in the 3 U cards themselves, which creates higher than normal thermal stresses across the card and can cause an overheat situation during periods of high power consumption.

What is needed, therefore, is a means to provide uniform cooling to both wedge clamp sides of 3 U cards, when used in a hybrid system that can also accommodate 6 U cards, that allows end users the most possible flexibility to use a variety of high-powered cards of varying sizes within a single chassis.

SUMMARY

The present disclosure teaches a liquid-cooled PCB chassis capable of accommodating multiple card form factors, in embodiments 3 U and 6 U form factors, and uniformly cooling both sizes of cards. This chassis provides a great deal of flexibility to end users, allowing them to incorporate a wide breadth of technological solutions into system designs.

Uniform cooling of 3 U cards in a 3 U/6 U hybrid chassis was accomplished by creating a 3 U/6 U hybrid chassis including a mid-height structure that includes a centrally-disposed cooling loop. Experimental result revealed uniform cooling of all 3 U and 6 U card wedge clamp rails by serial flow of cooling liquid, achieving efficient cooling even during periods of high power consumption.

In embodiments, Additive Manufacturing (AM) techniques are used to produce the sometimes-complex internal geometry required by embodiments of the disclosed chassis.

One embodiment of the present disclosure provides a chassis configured to hold a plurality of cards of at least two different form factors, the chassis comprising: side walls, a top wall, and a bottom wall; a plurality of slots disposed in an inner portion of the top and bottom chassis walls, wherein the slots on the top and bottom portions of the chassis are aligned with one another and configured to act as card guides; a mid-height structure disposed adjacent a side wall of the chassis, the mid-height structure comprising a second plurality of slots disposed on a top surface of the mid-height structure that is substantially parallel to the top wall of the chassis and a third plurality of slots disposed on a bottom surface of the mid-height structure that is substantially parallel to the bottom wall of the chassis; and a plurality of cooling channels disposed within the top wall, bottom wall, and at least one side wall of the chassis as well as within the mid-height structure, the cooling channels being configured to convey a cooling medium past the plurality of slots, second plurality of slots, and third plurality of slots, wherein the second plurality of slots are configured to align with at least a subset of the plurality of slots disposed in the inner portion of the top chassis wall and to act as card guides, and wherein the third plurality of slots are configured to align with at least a subset of the plurality of slots disposed in the inner portion of the bottom chassis wall and to act as card guides.

Another embodiment of the present disclosure provides such a chassis, wherein at least one of the side walls, top wall, or bottom wall is manufactured using an additive manufacturing technique.

A further embodiment of the present disclosure provides such a chassis, wherein components comprising cooling channels are manufactured using an additive manufacturing technique.

Yet another embodiment of the present disclosure provides such a chassis, wherein the plurality of cooling channels consists of cooling channels internal to the chassis.

A yet further embodiment of the present disclosure provides such a chassis, wherein the cards are printed circuit boards.

Still another embodiment of the present disclosure provides such a chassis, wherein cooling channels disposed in the top and/or bottom walls of the chassis are connected to those disposed in the mid-height structure using external interconnects.

A still further embodiment of the present disclosure provides such a chassis, wherein the external interconnects comprise hoses.

Even another embodiment of the present disclosure provides such a chassis, wherein the hoses are rubber hoses.

An even further embodiment of the present disclosure provides such a chassis, wherein the cooling medium is a cooling liquid.

A still even another embodiment of the present disclosure provides such a chassis, wherein the cooling liquid is polyalphaolefin.

A still even further embodiment of the present disclosure provides such a chassis, wherein the cooling medium is configured to flow into the mid-height structure from a top or bottom portion of a chassis side wall, to flow through a central portion of the mid-height structure that is in thermal communication with substantially a first half of the second plurality of slots and/or third plurality of slots, to then flow through a central portion of the mid-height structure that is in thermal communication with a second half of the second plurality of slots and/or third plurality of slots, and to then flow into a portion of the chassis side wall opposite from where it entered.

Still yet another embodiment of the present disclosure provides such a chassis, wherein the cooling medium is configured to flow into the mid-height structure from a top or bottom portion of a chassis side wall, to flow through a central portion of the mid-height structure that is in thermal communication with a first portion of the second plurality of slots and/or third plurality of slots, to then flow through a central portion of the mid-height structure that is in thermal communication with a second portion of the second plurality of slots and/or third plurality of slots, and to then flow into a portion of the chassis side wall opposite from where it entered.

A still yet further embodiment of the present disclosure provides such a chassis, wherein the mid-height structure is substantially centrally disposed between the top wall and the bottom wall of the chassis, providing card guides for equally-sized cards above and below.

Even yet another embodiment of the present disclosure provides such a chassis, wherein the mid-height structure is offset from a central position in the chassis, providing card guides for differently-sized cards above and below.

An even yet further embodiment of the present disclosure provides such a chassis, wherein the top wall, bottom wall, and side walls are fastened together using fasteners.

Still even yet another embodiment of the present disclosure provides such a chassis, wherein the fasteners are screws.

One embodiment of the present disclosure provides a chassis configured to hold a plurality of cards of at least two different form factors, the chassis comprising: side walls, a top wall, and a bottom wall; a plurality of slots disposed in an inner portion of the top and bottom chassis walls, wherein the slots on the top and bottom portions of the chassis are aligned with one another and configured to act as card guides; a mid-height structure disposed adjacent a side wall of the chassis, the mid-height structure comprising a second plurality of slots disposed on a top surface of the mid-height structure that is substantially parallel to the top wall of the chassis and a third plurality of slots disposed on a bottom surface of the mid-height structure that is substantially parallel to the bottom wall of the chassis; and a plurality of cooling channels disposed within the top wall, bottom wall, and at least one side wall of the chassis as well as within the mid-height structure, the cooling channels being configured to convey a cooling medium past the plurality of slots, second plurality of slots, and third plurality of slots, wherein the second plurality of slots are configured to align with at least a subset of the plurality of slots disposed in the inner portion of the top chassis wall and to act as card guides, wherein the third plurality of slots are configured to align with at least a subset of the plurality of slots disposed in the inner portion of the bottom chassis wall and to act as card guides, wherein the plurality of cooling channels consists of cooling channels internal to the chassis, and wherein the cooling medium is configured to flow into the mid-height structure from a top or bottom portion of a chassis side wall, to flow through a central portion of the mid-height structure that is in thermal communication with a first portion of the second plurality of slots and/or third plurality of slots, to then flow through a central portion of the mid-height structure that is in thermal communication with a second portion of the second plurality of slots and/or third plurality of slots, and to then flow into a portion of the chassis side wall opposite from where it entered.

Another embodiment of the present disclosure provides such a chassis, wherein the cards are printed circuit boards.

A further embodiment of the present disclosure provides such a chassis, wherein the cooling medium is a cooling liquid.

Yet another embodiment of the present disclosure provides such a chassis, wherein the cooling liquid is polyalphaolefin.

Implementations of the techniques discussed above may include a method or process, a system or apparatus, a kit, or a computer software stored on a computer-accessible medium. The details or one or more implementations are set forth in the accompanying drawings and the description below. Other features will be apparent from the description and drawings, and form the claims.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale, unless otherwise noted. For purposes of clarity, not every component may be labeled in every drawing.

DETAILED DESCRIPTION

The present disclosure teaches a liquid-cooled PCB chassis capable of accommodating and uniformly cooling multiple card form factors, in embodiments 3 U and 6 U form factors, and a method of producing the same. This chassis provides a great deal of flexibility to end users, allowing them to incorporate a wide breadth of technological solutions into system designs, while the disclosed method of Additive Manufacturing (AM) enables fabrication of a robust, vibration resistant chassis with fewer production steps, with more preferred geometries that are not possible or are very difficult to achieve using conventional production and machining techniques, and without any requirement for brazing, thereby avoiding the distortion and warping concerns that arise from brazing, and reducing costs and the time required to produce a first article of manufacture, while allowing the production of the features needed to achieve uniform cooling where dissimilar form factor cards are used in a single chassis.

Regarding the use of the term Additive Manufacturing, AM is used herein to refer specifically and exclusively to 3D printing methods that are applicable to metals. The definitions of "additive manufacture" and "AM," as the terms are used herein, do not extend to other methods of manufacture in which elements are combined or "added" to each other, such as welding, brazing, soldering, gluing, riveting, bolting, etc.

Figure 1:
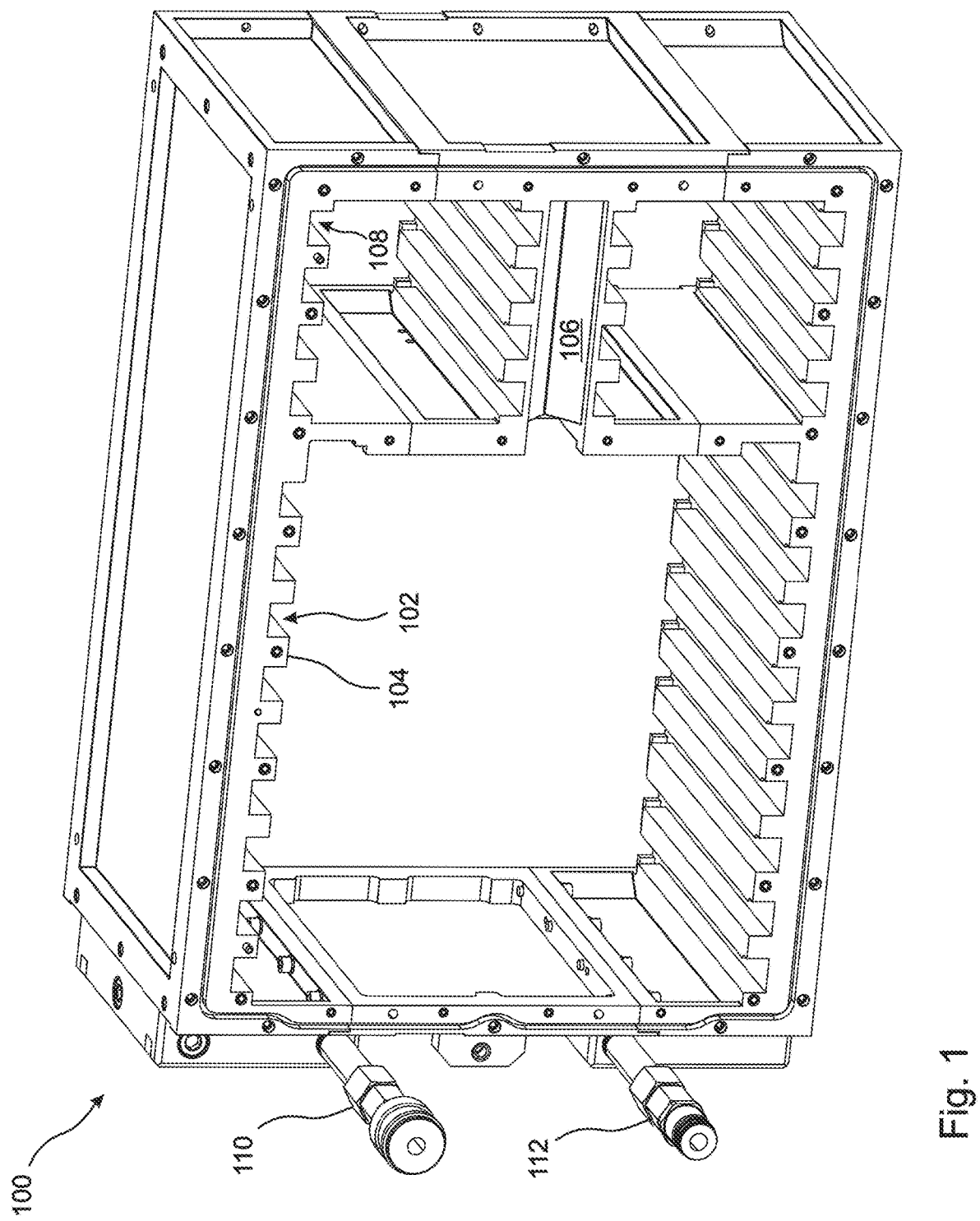
FIG. 1 is a perspective view drawn to scale of a liquid-cooled printed circuit board chassis in an exemplary embodiment of the present disclosure.
Figure 2:
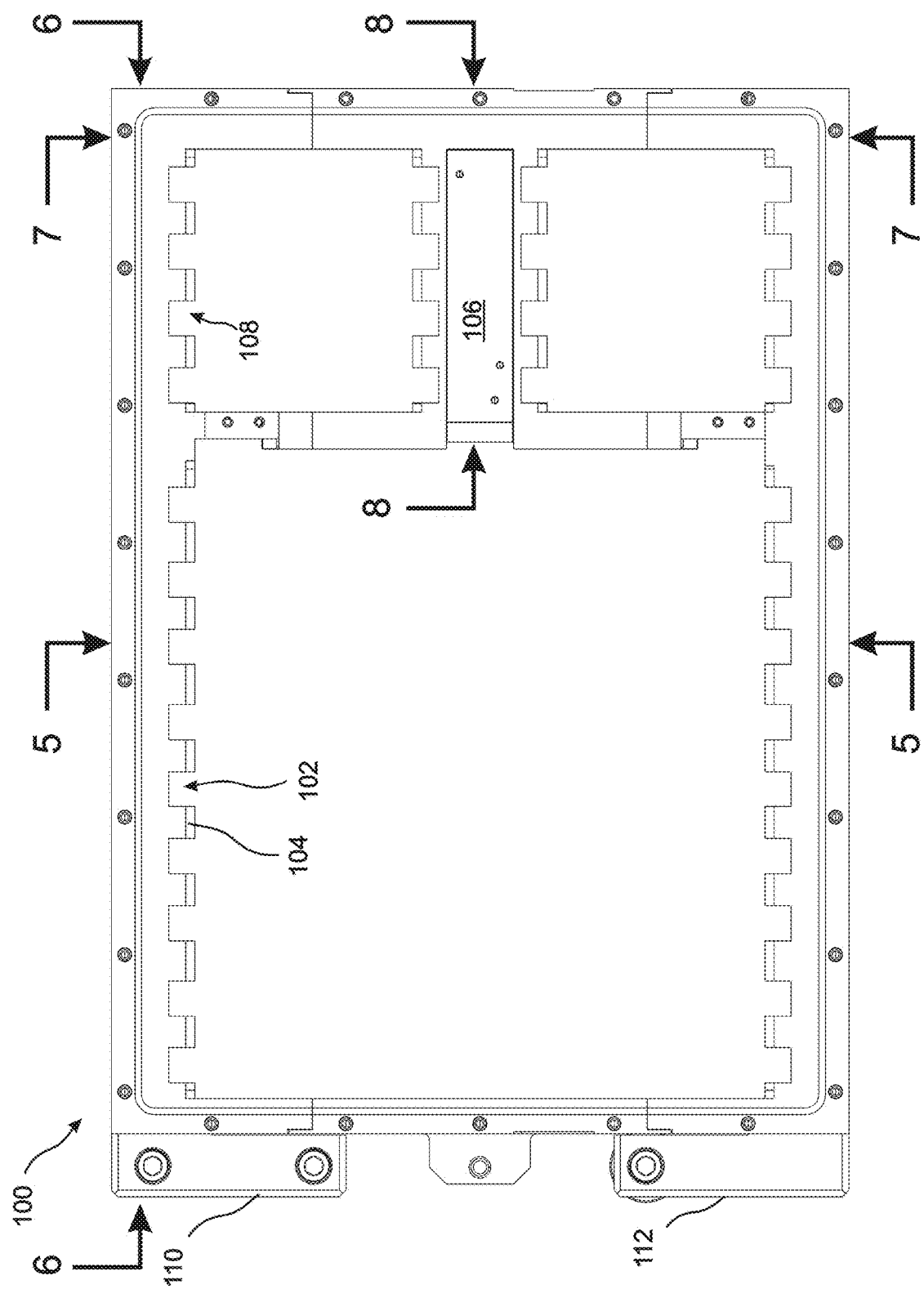
FIG. 2 is a side view drawn to scale of the embodiment of FIG. 1.

An exemplary embodiment of the present disclosure is illustrated in the perspective view of FIG. 1 and the side view of FIG. 2. In the illustrated embodiment, a chassis 100 is provided within which nine 6 U printed circuit boards (PCBs, not shown) can be mounted by sliding them into 6 U "slots" 102 formed by card guides 104 provided on the top and bottom of the chassis 100 so that the PCB boards stand on end, like books on a shelf. The illustrated embodiment includes a mid-height structure 106 that divides a right-most portion of the chassis 100 into eight 3 U slots 108, four upper slots and four lower slots. The teachings conveyed herein, however, could be applied to any form factor card used in a chassis designed to accommodate a card with a form factor just over twice as large in a single dimension, to allow space to accommodate the mid-height structure 106, or even to additional cards of mismatched heights, where the larger card is roughly similar in size to a pair of differently-sized, smaller cards. Cooling channels and interconnecting channels through which a cooling liquid, such as PAO (polyalphaolefin), can be circulated, discussed in more detail below, are also included in the chassis 100 and through a central portion of the mid-height structure 106 located between opposing, central card guides 104.

Figure 3:
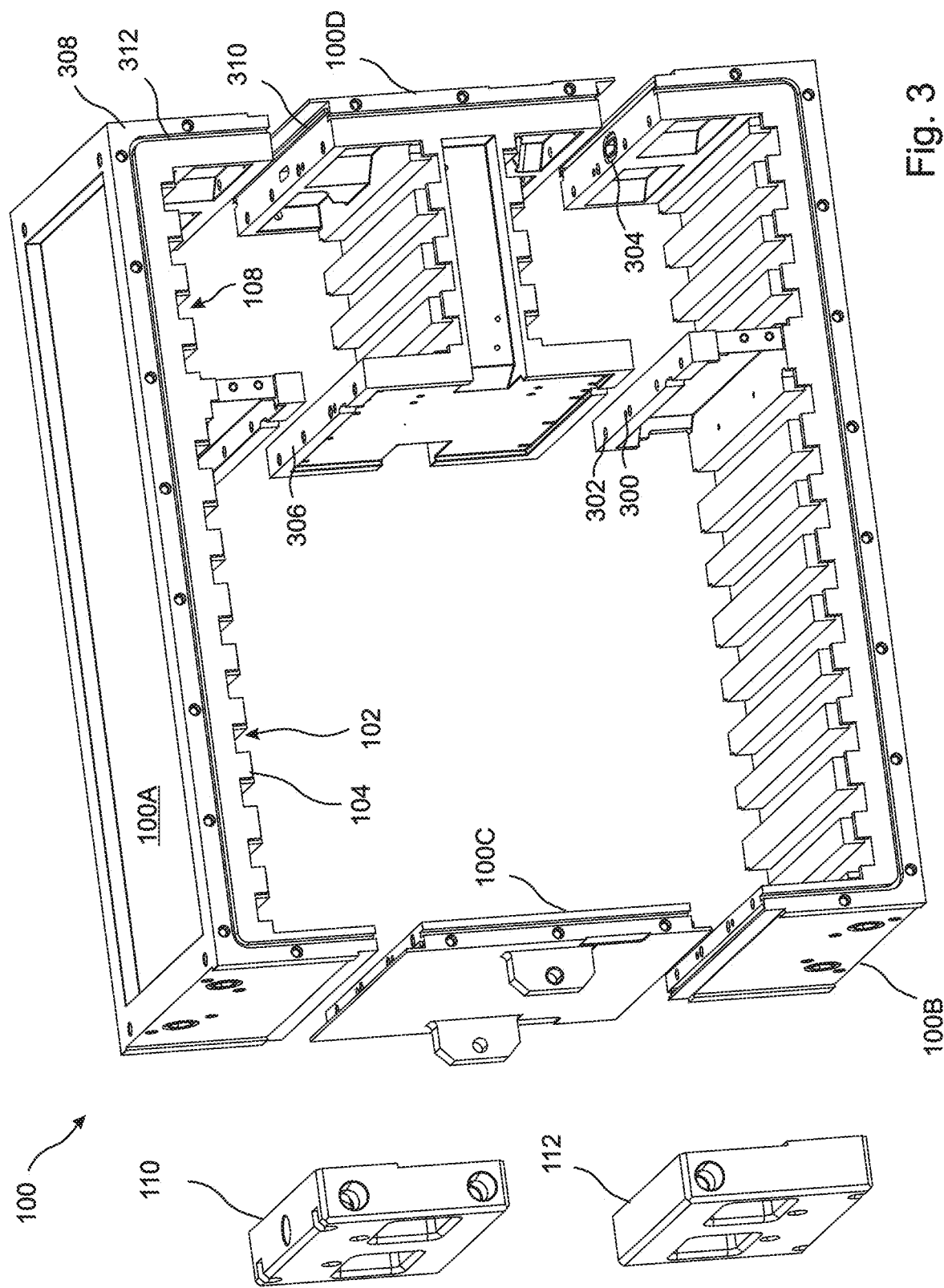
FIG. 3 is an exploded perspective view drawn to scale of the embodiment of FIG. 1.
Figure 4:
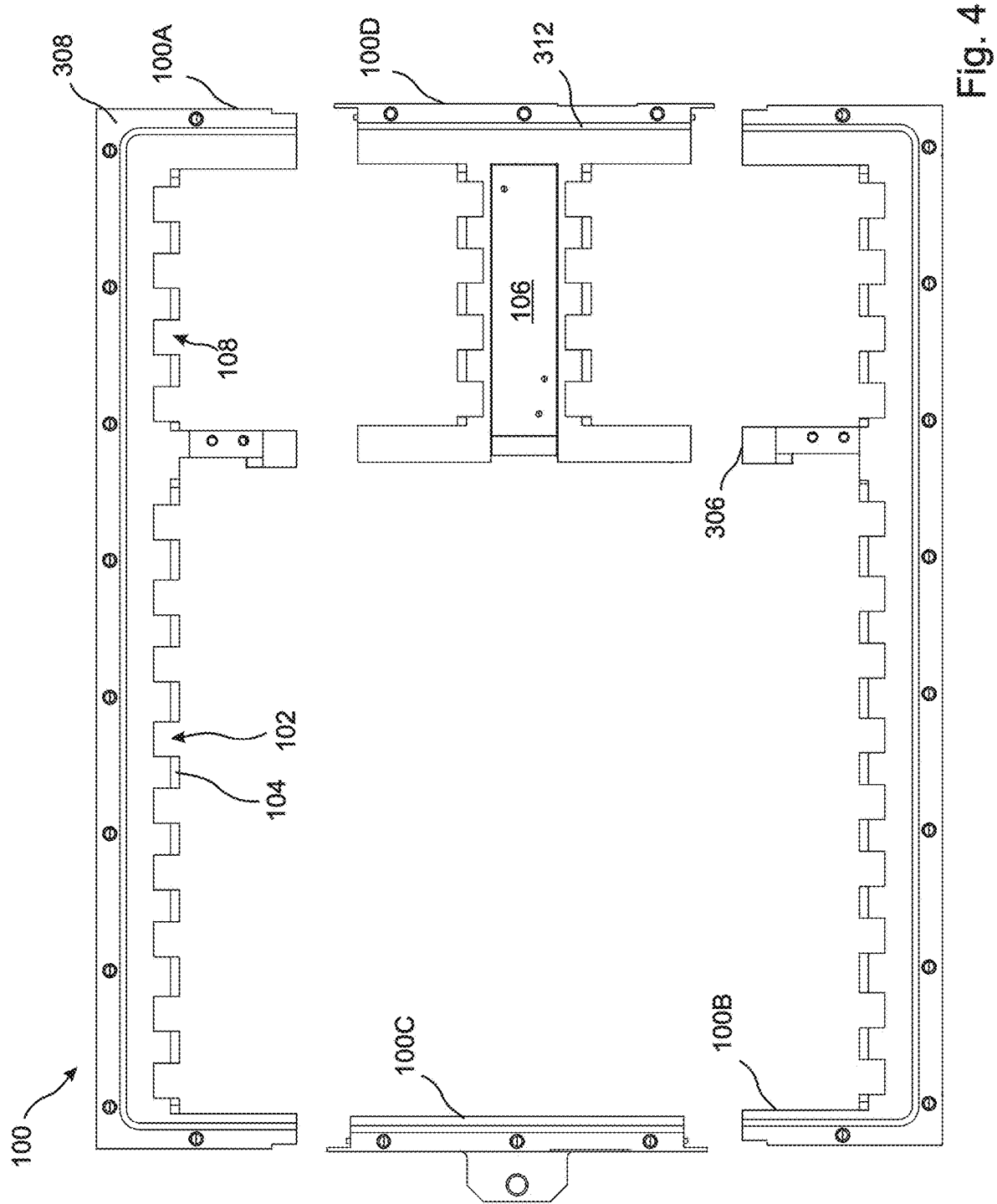
FIG. 4 is a side exploded view drawn to scale of the embodiment of FIG. 1.

With reference to the exploded perspective and side views of FIGS. 3 and 4, respectively, the PCB chassis 100 is, in embodiments, produced by using additive manufacture to create at least chassis components 100A, 100B, 100D (the mid-height structure 106) that include cooling channels, which may then be separately machined to provide highly smooth slot guides 104, end faces 306, and side faces 308, as well as precisely dimensioned slots 102, 108. Chassis components 100C that do not include cooling channels can be readily produced by additive manufacture or by conventional machining while chassis components containing cooling channels 100B and 100D are more easily manufactured using AM techniques, although they too may also be fabricated using conventional machining.

The chassis components 100A-D may further include alignment pin holes 300 and attachment screw holes 302, allowing the chassis components 100A-D to be readily assembled in precise alignment after machining to provide the complete chassis 100. In embodiments, O-ring grooves 304 or similar provisions are included to enable liquid-tight sealing between the cooling fluid channels of the chassis components. The illustrated embodiment further includes EMI gasket grooves 310, 312 in which EMI gaskets can be installed to prevent EMI leakage between the assembled components 100A, 100B, 100C, 100D.

Figure 5:
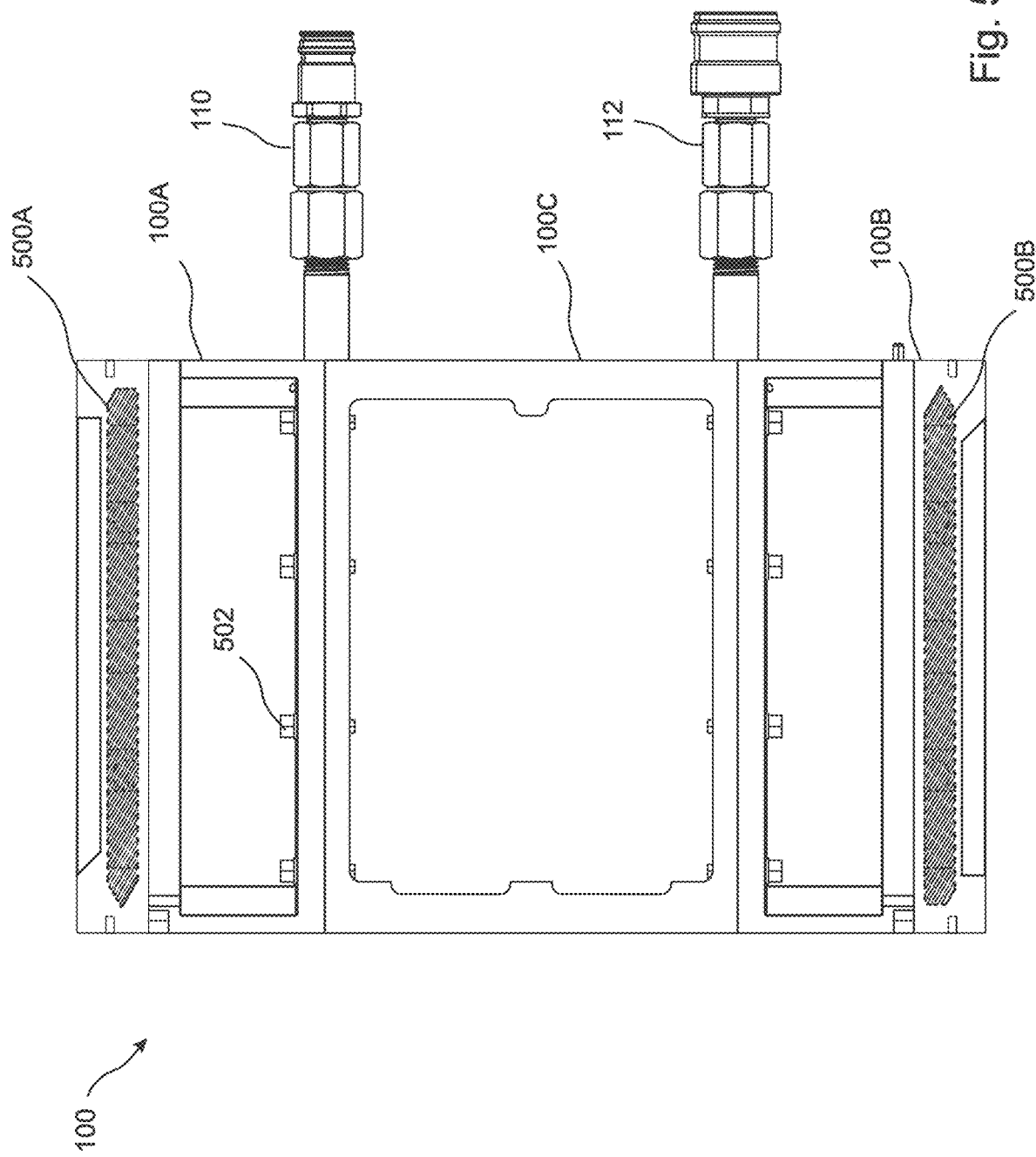
FIG. 5 is a central vertical sectional view drawn to scale of the embodiment of FIG. 2.

With reference to FIG. 5, cooling channels 500A, 500B, are formed within the upper 100A and lower 100B chassis components of the chassis 100 during the additive manufacture process. FIG. 5 is a vertical sectional view taken along the plane indicated in FIG. 2. It can be seen in the drawing that the cooling channels 500A, 500B in the illustrated embodiment are long, slanted, rectangular channels. Attachment screws 502 are also visible in the drawing. In the illustrated embodiment four attachment screws are implemented along each of the inter-component joints to ensure robust vibration resistance and full engagement of the cooling liquid gaskets 304 and the EMI gaskets 310. Cooling fluid may be introduced through chassis inlet 110 and expelled through chassis outlet 112.

Figure 6:
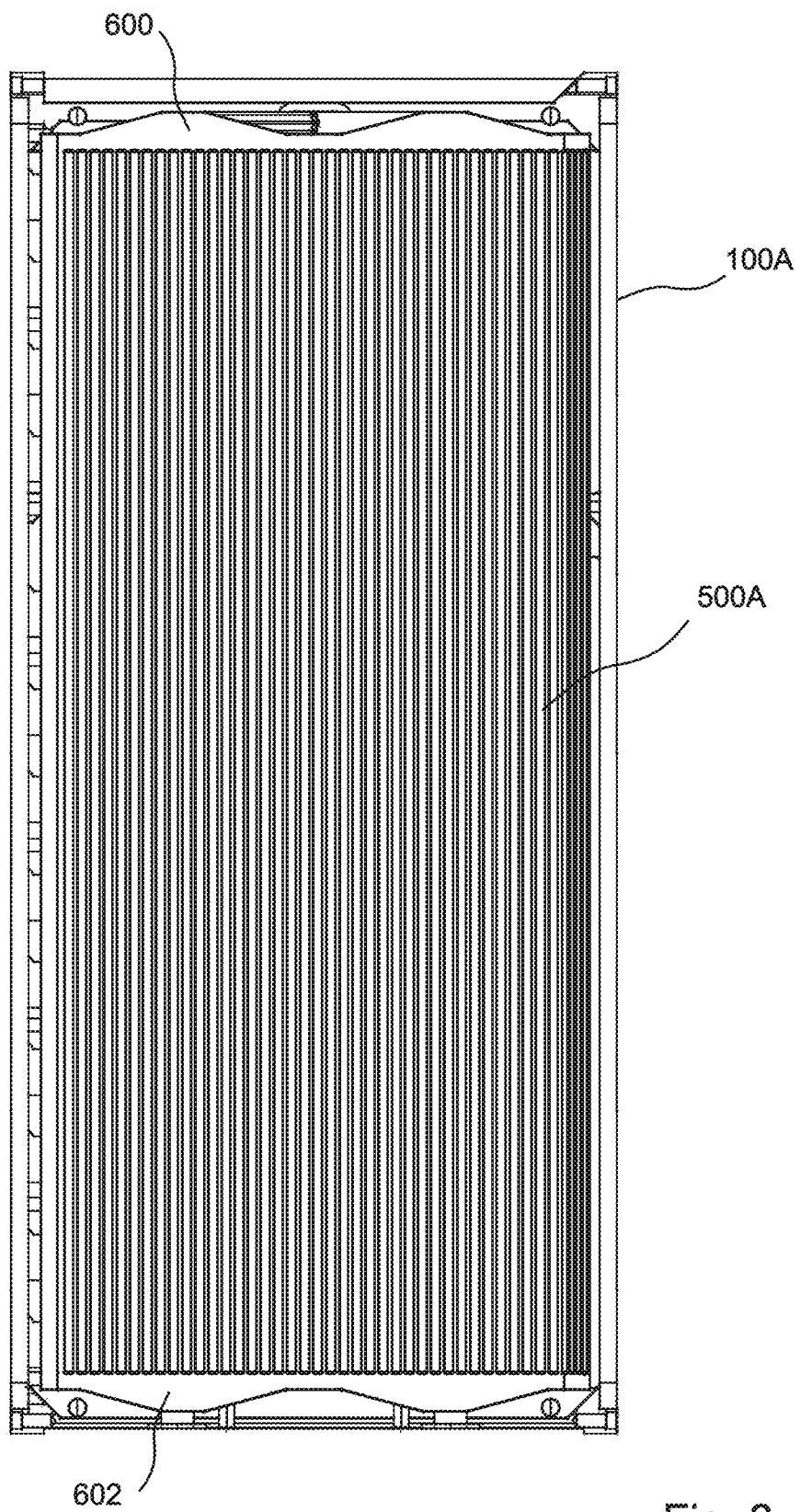
FIG. 6 is a horizontal upper sectional view drawn to scale of the embodiment of FIG. 2.

FIG. 6 is a horizontal, sectional view, taken along the plane indicated in FIG. 2, of the cooling channels 500A in the upper chassis component 100A of the chassis 100. The cooling channels 500A extend in thermal contact with the slot guides 104 along most of the length of the chassis component 100A, and terminate at each end in a manifold 600, 602. The cooling liquid enters from the chassis inlet 110 into the first manifold 600, which distributes the cooling liquid among the separate, narrow cooling channels 500A that flow in parallel with each other. The dividing walls between the narrow channels function as fins or baffles that exchange heat with the cooling liquid. A second manifold 602 collects and recombines the separate streams of cooling liquid as they emerge from the narrow channels 500A.

Figure 7:
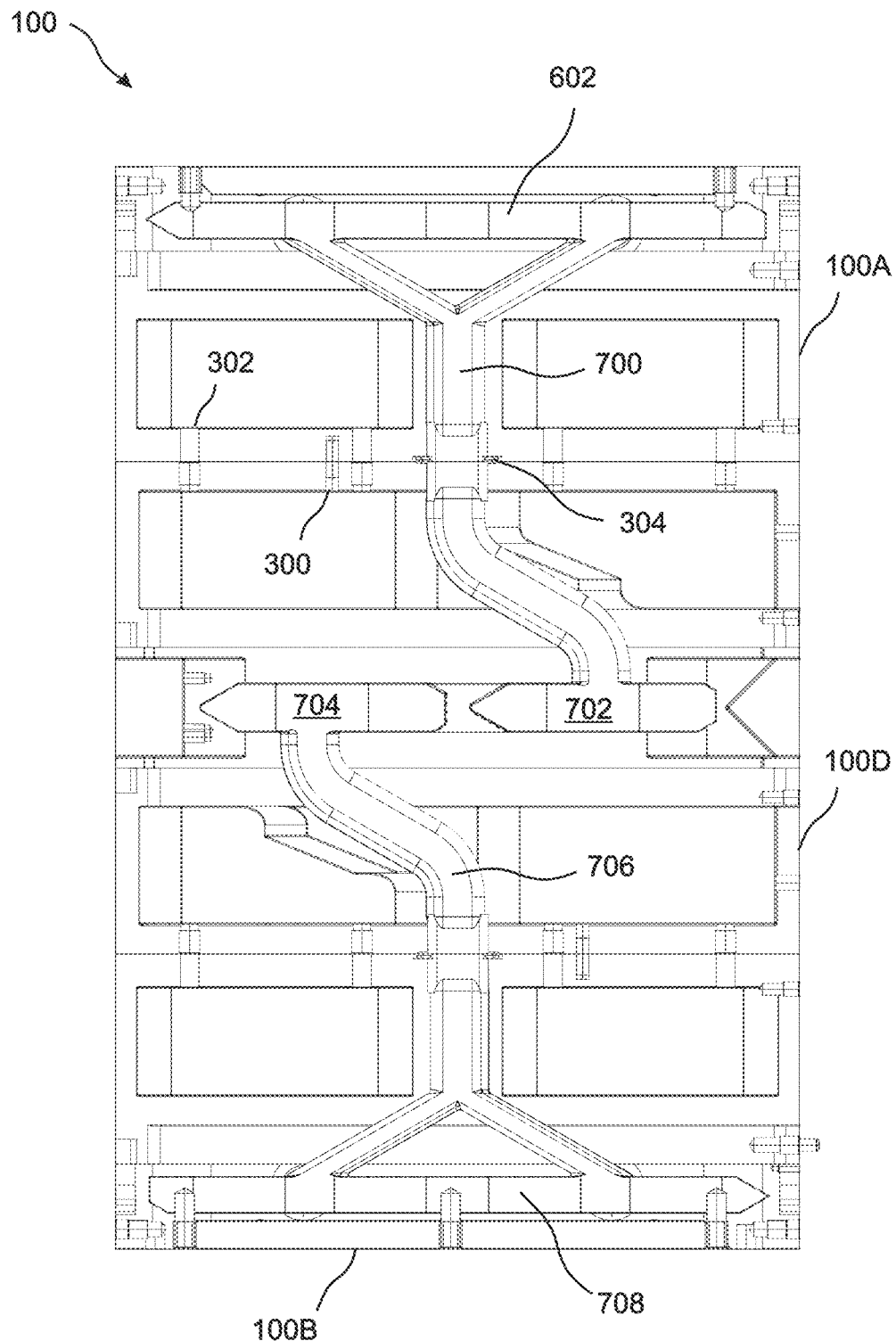
FIG. 7 is a right-side vertical sectional view drawn to scale of the embodiment of FIG. 2.

FIG. 7 is a vertical sectional view, taken along the plane indicated in FIG. 2 at the right side of the chassis 100, passing through chassis component 100D. It can be seen in the drawing that the cooling liquid that is collected in upper manifold 602 flows through a first connecting channel 700 through a liquid-tight interconnection 304 to an inlet manifold 702 provided in the right-side chassis component 100D. After flowing through the right-side chassis component 100D, the cooling liquid emerges from an outlet manifold 704 and enters a second connecting channel 706, which directs the cooling liquid through another liquid-tight connection to a lower manifold 708 of the lower chassis component 100B.

Instead of interconnecting the cooling channels with hoses, the AM manufacturing of the disclosed method enables the relatively complex connecting channels 700, 706 to be easily incorporated into the side walls of the chassis components 100A, 100D, 100B, thereby providing a more compact and reliable design as compared to conventional, brazed designs that use hoses to interconnect the cooling channels. In embodiments, however, the inlet manifold 702 and outlet manifold 704 of chassis component 100D, the mid-height structure 106, are connected to the first connecting channel 700 and the second connecting channel 706, or to manifold 602 and/or the inlet manifold of the lower chassis component 100B directly, using external interconnects, such as rubber hoses.

In the embodiment depicted in FIG. 7, the inlet manifold 702 directs the cooling liquid substantially orthogonally from the right-side chassis wall into a central portion of the of the mid-height structure 106, past a rear half of slots 108, and the outlet manifold 704 receives the cooling liquid after it has travelled past a front half of slots 108 disposed in the mid-height structure, achieving serial cooling of those components. In other embodiments, however, coolant may flow from front to back, through a series of vertical channels in the mid-height structure, through multiple parallel channels simultaneously, and/or inlet and outlet channels may be asymmetric to provide enhanced cooling to a subset of cards. Alternative geometries of these cooling channels are also possible, as would be known to one of ordinary skill in the art.

Figure 8:
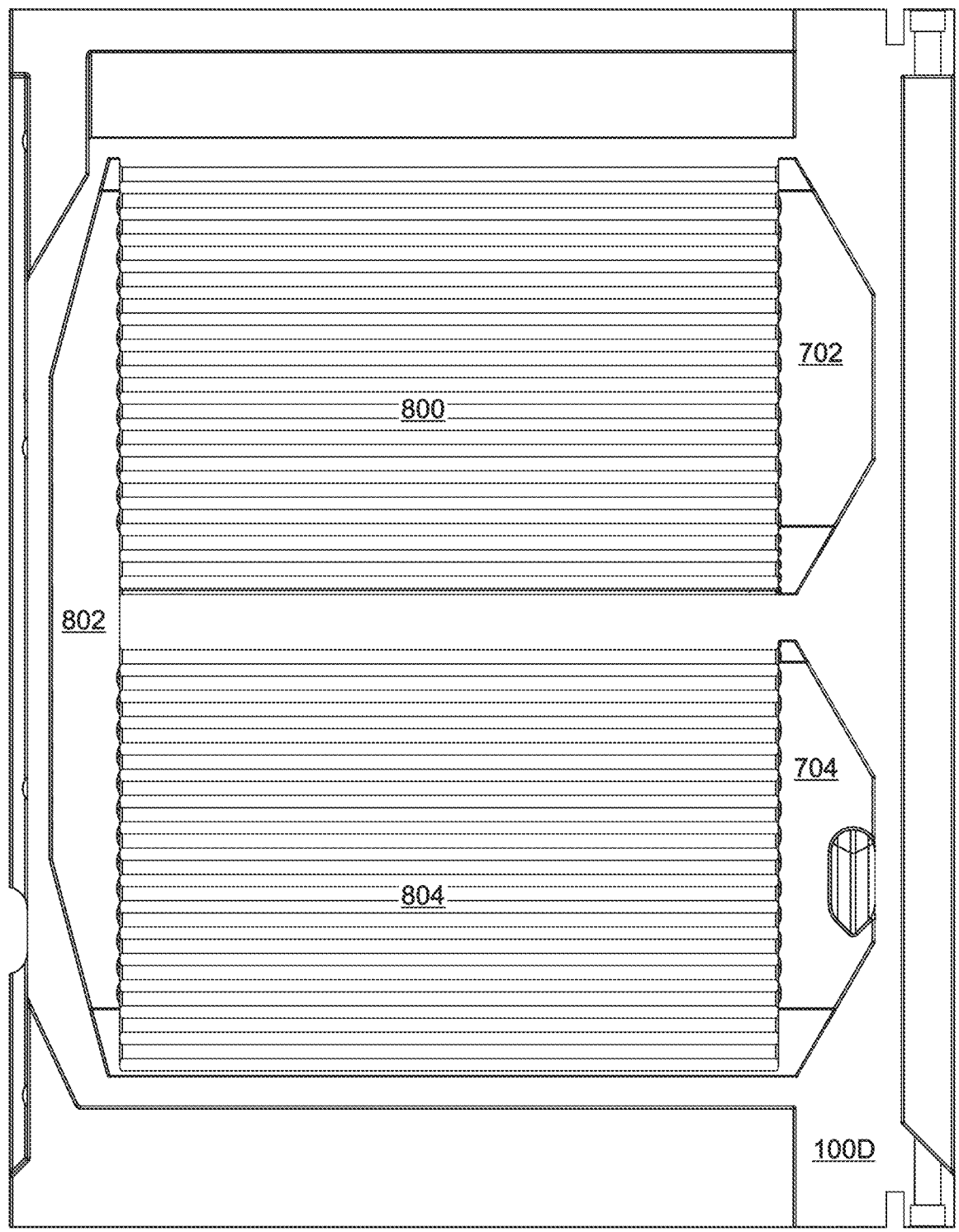
FIG. 8 is a horizontal sectional view drawn to scale of the right-side chassis component, in accordance with embodiments of the present disclosure.

FIG. 8 is a horizontal sectional view taken along the plane indicated in FIG. 2 which illustrates the horizontal cooling channels 800, 804 and manifolds 702, 802, 704 of the right-side chassis component 100D of the chassis 100. In particular, the inlet manifold 702 distributes the cooling liquid among a first plurality of cooling channels 800. The cooling liquid is then consolidated by an intermediate manifold 802, and distributed among a second plurality of cooling channels 804. Finally, the cooling liquid is consolidated by the outlet manifold 704 and directed into the second connecting channel 706. The configurations of the cooling channels 600, 604 in the right-side chassis component 100D are similar in configuration to the cooling channels 500A, 500B in the upper 100A and lower 100B chassis components of the chassis 100.

Figure 9:
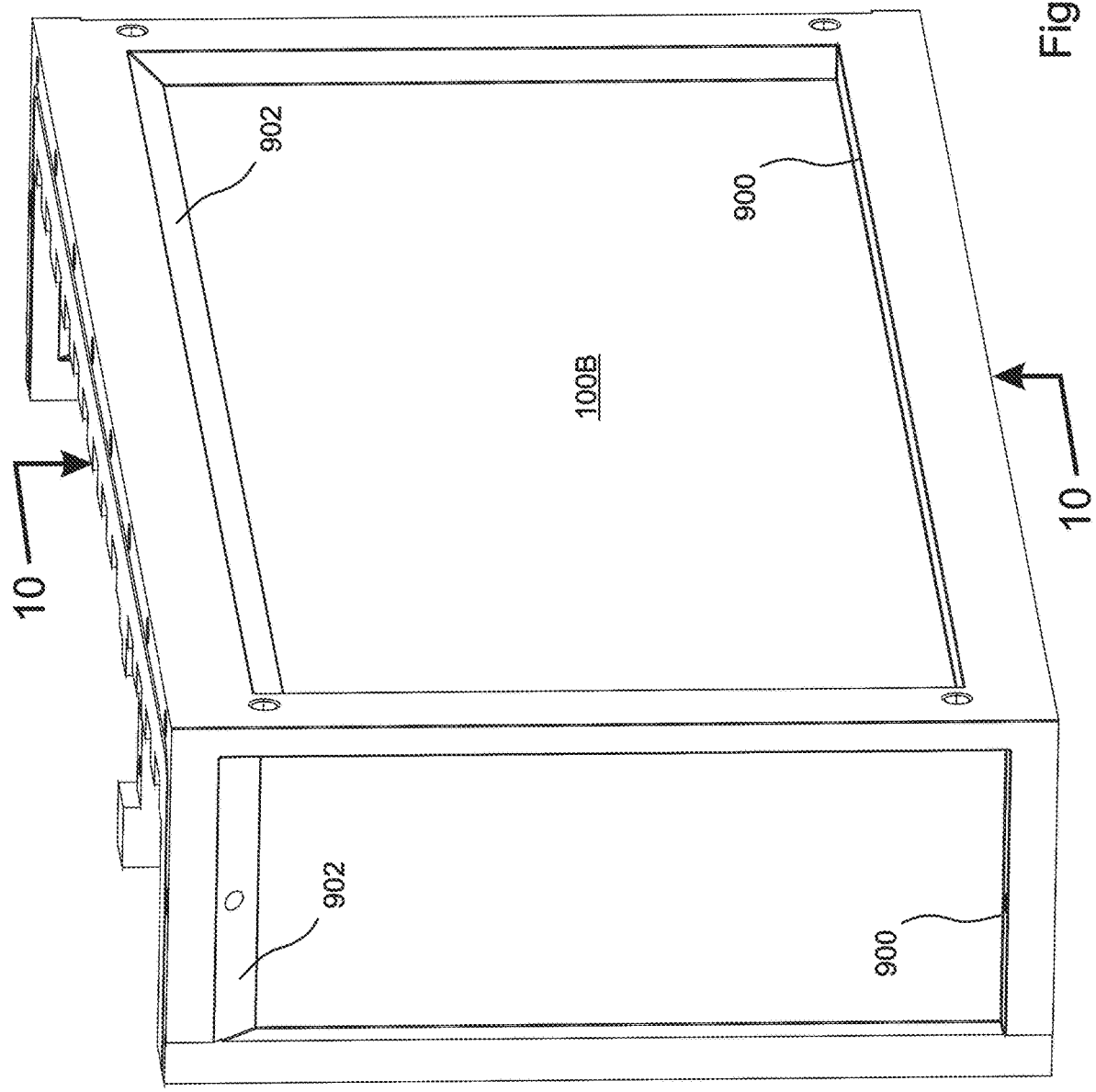
FIG. 9 is a perspective view drawn to scale of the bottom chassis component of the embodiment of FIG. 3.

As discussed above, additive manufacturing (AM) is not able to create severe overhangs. In general, without added support, which must later be removed, structures cannot "grow" during AM at an angle that is more than 45 degrees away from vertical. FIG. 9 is a perspective view of the bottom chassis component 100B of the exemplary embodiment, oriented as it would be during additive manufacture. The "shelves" 900 near the base of the chassis component 100B are horizontal, however, "shelves" 902 that are higher up are slanted at an angle of about 45 degrees from vertical. This approach avoids the need to include support structure which would require removal after the AM was complete. Growing the component 100B in this orientation also allows it to be positioned diagonally on the printer bed, thereby reducing the size of the bed that is required.

Figure 10:
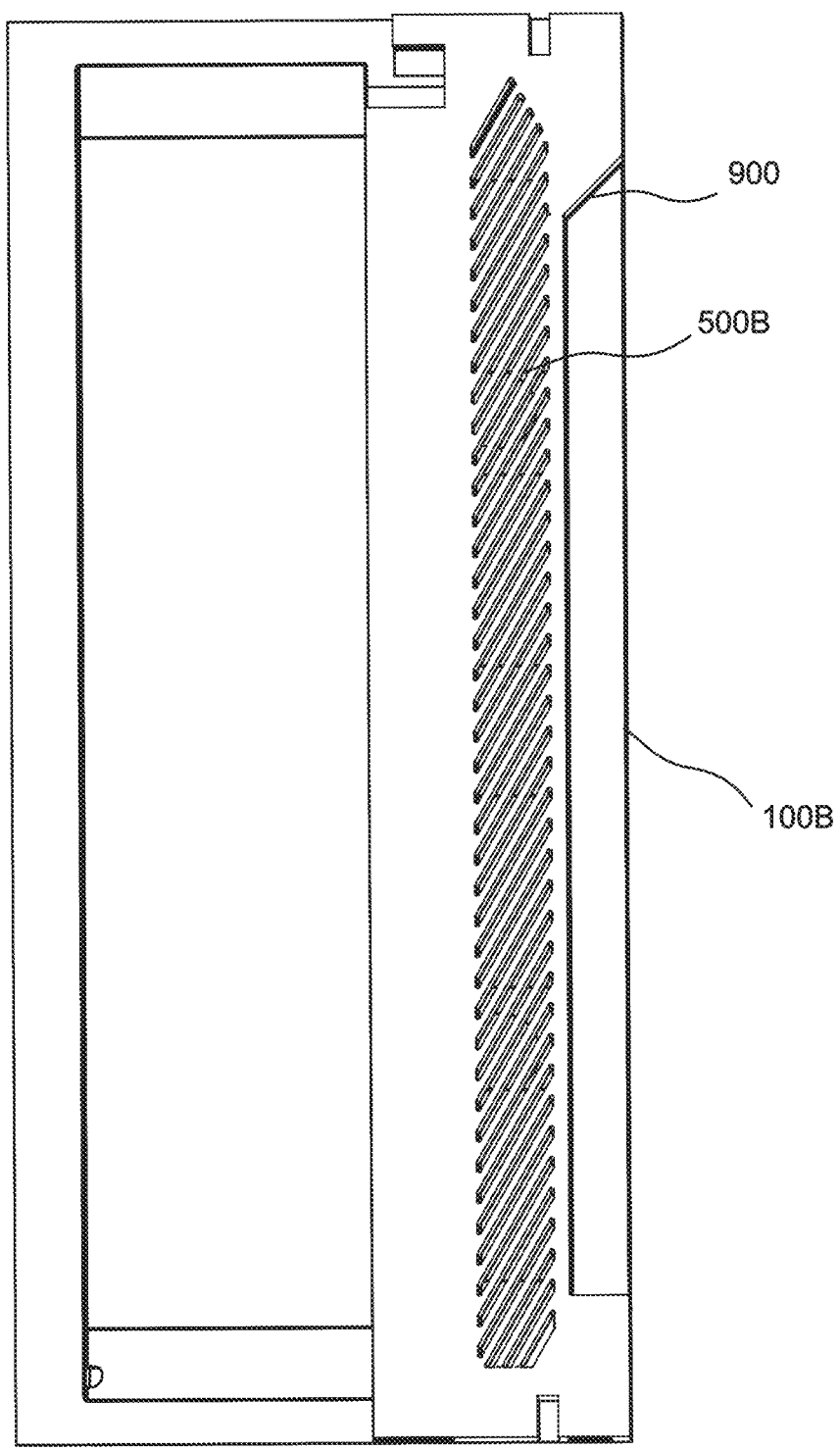
FIG. 10 is a central vertical sectional view drawn to scale of the chassis component of FIG. 9.

FIG. 10 is a sectional view taken in the plane indicated in FIG. 9, also oriented as it would be during manufacture. It can clearly be seen that the "walls" between the cooling channels 500B, which function as the "baffles" of the cooling channels 500B, are inclined at an angle of much less than 45 degrees from vertical. By slanting these baffle walls, their contact surface area with the cooling liquid is significantly increased, thereby increasing the cooling efficiency of the channels, significantly improving the overall efficiency and capacity of the heat exchanger. This slanting of the baffles would be difficult or impossible to achieve by vacuum brazing. Furthermore, inclining the baffle walls at this angle eliminates any need for temporary support structure when forming the baffles by AM. Because the cooling channels 500A, 500B, 700, 704 are fully enclosed, it would not be possible to remove support structure if any were needed. Furthermore, the rough texture that naturally results on the baffle surfaces from the AM process provides an unexpected, secondary benefit in that it serves to increase the baffle surface area and generate turbulence within the cooling channels 500A, 500B, 700, 704, thereby further improving the cooling efficiency. This cooling channel and baffle configuration, which is readily produced by additive manufacture, would be difficult or impossible to produce by conventional means.

In summary, instead of relying on brazing, the disclosed method includes using additive manufacture to produce a plurality of complex chassis components 100A, 100B, 100D that comprise internal cooling-liquid channels 500A, 500B, 802, 804 with baffles, thereby providing uniform cooling, even where mixed form-factor cards are used, while reducing the number of manufacturing steps that are required. Interconnections between the cooling channels 500A, 500B, 802, 804 are provided by connecting channels 700, 706, that are also formed within the chassis components 100A, 100D, 100B by additive manufacture, thereby providing a more compact and reliable design as compared to conventional, brazed designs that use hoses to interconnect the cooling channels. After 3D printing and post-AM machining, alignment pins may be used to precisely position the components 100A, 100B, 100C, 100D, which are then fastened together using a plurality of bolts or screws 502 that provide robust, vibration-resistant joining. In embodiments, EMI gaskets are installed in grooves 310 formed in end faces 306 of the components 100A, 100B, 100D to prevent EMI leakage.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the order shown or in sequential order, or that all illustrated operations be performed, to achieve desirable results.

What is claimed is:

1. A chassis configured to hold a plurality of cards of at least two different form factors, the chassis comprising:
   side walls, a top wall, and a bottom wall;
   a plurality of slots disposed in an inner portion of the top and bottom chassis walls, wherein the slots on the top and bottom portions of the chassis are aligned with one another and configured to act as card guides;
   a mid-height structure disposed adjacent a side wall of the chassis, the mid-height structure comprising a second plurality of slots disposed on a top surface of the mid-height structure that is substantially parallel to the top wall of the chassis and a third plurality of slots disposed on a bottom surface of the mid-height structure that is substantially parallel to the bottom wall of the chassis; and
   a plurality of cooling channels disposed within the top wall, bottom wall, and at least one side wall of the chassis as well as within the mid-height structure, the cooling channels being configured to convey a cooling medium past the plurality of slots, second plurality of slots, and third plurality of slots,
   wherein the second plurality of slots are configured to align with at least a subset of the plurality of slots disposed in the inner portion of the top chassis wall and to act as card guides, and
   wherein the third plurality of slots are configured to align with at least a subset of the plurality of slots disposed in the inner portion of the bottom chassis wall and to act as card guides.

2. The chassis of claim 1, wherein at least one of the side walls, top wall, or bottom wall is manufactured using an additive manufacturing technique.

3. The chassis of claim 1, wherein components comprising cooling channels are manufactured using an additive manufacturing technique.

4. The chassis of claim 1, wherein the plurality of cooling channels consists of cooling channels internal to the chassis.

5. The chassis of claim 1, wherein the cards are printed circuit boards.

6. The chassis of claim 1, wherein cooling channels disposed in the top and/or bottom walls of the chassis are connected to those disposed in the mid-height structure using external interconnects.

7. The chassis of claim 6, wherein the external interconnects comprise hoses.

8. The chassis of claim 7, wherein the hoses are rubber hoses.

9. The chassis of claim 1, wherein the cooling medium is a cooling liquid.

10. The chassis of claim 9, wherein the cooling liquid is polyalphaolefin.

11. The chassis of claim 1, wherein the cooling medium is configured to flow into the mid-height structure from a top or bottom portion of a chassis side wall, to flow through a central portion of the mid-height structure that is in thermal communication with substantially a first half of the second plurality of slots and/or third plurality of slots, to then flow through a central portion of the mid-height structure that is in thermal communication with a second half of the second plurality of slots and/or third plurality of slots, and to then flow into a portion of the chassis side wall opposite from where it entered.

12. The chassis of claim 1, wherein the cooling medium is configured to flow into the mid-height structure from a top or bottom portion of a chassis side wall, to flow through a central portion of the mid-height structure that is in thermal communication with a first portion of the second plurality of slots and/or third plurality of slots, to then flow through a central portion of the mid-height structure that is in thermal communication with a second portion of the second plurality of slots and/or third plurality of slots, and to then flow into a portion of the chassis side wall opposite from where it entered.

13. The chassis of claim 1, wherein the mid-height structure is substantially centrally disposed between the top wall and the bottom wall of the chassis, providing card guides for equally-sized cards above and below.

14. The chassis of claim 1, wherein the mid-height structure is offset from a central position in the chassis, providing card guides for differently-sized cards above and below.

15. The chassis of claim 1, wherein the top wall, bottom wall, and side walls are fastened together using fasteners.

16. The chassis of claim 15, wherein the fasteners are screws.

17. A chassis configured to hold a plurality of cards of at least two different form factors, the chassis comprising:
   side walls, a top wall, and a bottom wall;
   a plurality of slots disposed in an inner portion of the top and bottom chassis walls, wherein the slots on the top and bottom portions of the chassis are aligned with one another and configured to act as card guides;
   a mid-height structure disposed adjacent a side wall of the chassis, the mid-height structure comprising a second plurality of slots disposed on a top surface of the mid-height structure that is substantially parallel to the top wall of the chassis and a third plurality of slots disposed on a bottom surface of the mid-height structure that is substantially parallel to the bottom wall of the chassis; and
   a plurality of cooling channels disposed within the top wall, bottom wall, and at least one side wall of the chassis as well as within the mid-height structure, the cooling channels being configured to convey a cooling medium past the plurality of slots, second plurality of slots, and third plurality of slots,
   wherein the second plurality of slots are configured to align with at least a subset of the plurality of slots disposed in the inner portion of the top chassis wall and to act as card guides, wherein the third plurality of slots are configured to align with at least a subset of the plurality of slots disposed in the inner portion of the bottom chassis wall and to act as card guides, wherein the plurality of cooling channels consists of cooling channels internal to the chassis, and wherein the cooling medium is configured to flow into the mid-height structure from a top or bottom portion of a chassis side wall, to flow through a central portion of the mid-height structure that is in thermal communication with a first portion of the second plurality of slots and/or third plurality of slots, to then flow through a central portion of the mid-height structure that is in thermal communication with a second portion of the second plurality of slots and/or third plurality of slots, and to then flow into a portion of the chassis side wall opposite from where it entered.

18. The chassis of claim 17, wherein the cards are printed circuit boards.

19. The chassis of claim 18, wherein the cooling medium is a cooling liquid.

20. The chassis of claim 19, wherein the cooling liquid is polyalphaolefin.

* * * * *